(12) United States Patent
Bower et al.

(10) Patent No.: US 9,537,069 B1
(45) Date of Patent: Jan. 3, 2017

(54) INORGANIC LIGHT-EMITTING DIODE WITH ENCAPSULATING REFLECTOR

(71) Applicant: X-Celeprint Limited, Cork (IE)

(72) Inventors: Christopher Bower, Raleigh, NC (US); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 14/788,632

(22) Filed: Jun. 30, 2015

(51) Int. Cl.
| | |
|---|---|
| H01L 33/60 | (2010.01) |
| H01L 27/15 | (2006.01) |
| H01L 33/54 | (2010.01) |
| H01L 33/38 | (2010.01) |

(52) U.S. Cl.
CPC .............. *H01L 33/60* (2013.01); *H01L 27/156* (2013.01); *H01L 33/38* (2013.01); *H01L 33/54* (2013.01)

(58) Field of Classification Search
CPC .......... H01L 33/60; H01L 33/38; H01L 33/54; H01L 27/156
USPC ......................................................... 257/98
See application file for complete search history.

(56) References Cited

U.S. PATENT DOCUMENTS

| | | | |
|---|---|---|---|
| 5,550,066 | A | 8/1996 | Tang et al. |
| 5,621,555 | A | 4/1997 | Park |
| 5,815,303 | A | 9/1998 | Berlin |
| 5,994,722 | A | 11/1999 | Averbeck et al. |
| 6,084,579 | A | 7/2000 | Hirano |
| 6,184,477 | B1 | 2/2001 | Tanahashi |
| 6,278,242 | B1 | 8/2001 | Cok et al. |
| 6,392,340 | B2 | 5/2002 | Yoneda et al. |
| 6,466,281 | B1 | 10/2002 | Huang et al. |
| 6,504,180 | B1 * | 1/2003 | Heremans ............ G02B 6/4249 257/88 |

(Continued)

FOREIGN PATENT DOCUMENTS

| | | |
|---|---|---|
| WO | WO-2006/027730 A1 | 3/2006 |
| WO | WO-2006/099741 A1 | 9/2006 |

(Continued)

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

(Continued)

*Primary Examiner* — Asok K Sarkar
*Assistant Examiner* — Grant Withers
(74) *Attorney, Agent, or Firm* — Choate, Hall & Stewart LLP; William R. Haulbrook

(57) ABSTRACT

An inorganic light-emitting diode structure includes a transparent substrate and an inorganic semiconductor having a conduction layer and a light-emitting layer over and in contact with only a portion of the conduction layer. A first metal contact is in electrical contact with the conduction layer and a second metal contact is in electrical contact with a second contact portion of the light-emitting layer so that a current supplied between the first metal contact and the second metal contact through the inorganic semiconductor causes the light-emitting layer to emit light. A dielectric layer is located over at least a portion of the light-emitting layer and a reflective layer is located over at least a portion of the dielectric layer. The reflective layer encapsulates the light-emitting layer exclusive of the portion of the conduction layer in contact with the light-emitting layer.

25 Claims, 5 Drawing Sheets

(56) References Cited

U.S. PATENT DOCUMENTS

| | | |
|---|---|---|
| 6,577,367 B2 | 6/2003 | Kim |
| 6,660,457 B1 | 12/2003 | Imai et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,933,532 B2 | 8/2005 | Arnold et al. |
| 7,012,382 B2 | 3/2006 | Cheang et al. |
| 7,091,523 B2 | 8/2006 | Cok et al. |
| 7,129,457 B2 | 10/2006 | McElroy et al. |
| 7,195,733 B2 | 3/2007 | Rogers et al. |
| 7,288,753 B2 | 10/2007 | Cok |
| 7,402,951 B2 | 7/2008 | Cok |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,854,294 B2 | 10/2014 | Sakariya |
| 8,877,648 B2 | 11/2014 | Bower et al. |
| 8,889,485 B2 | 11/2014 | Bower |
| 8,895,406 B2 | 11/2014 | Rogers et al. |
| 8,987,765 B2 | 3/2015 | Bibl et al. |
| 9,202,996 B2 | 12/2015 | Orsley et al. |
| 2001/0022564 A1 | 9/2001 | Youngquist et al. |
| 2002/0096994 A1 | 7/2002 | Iwafuchi et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0275615 A1 | 12/2005 | Kahen et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2009/0315054 A1* | 12/2009 | Kim ............ H01L 33/20 257/98 |
| 2010/0078670 A1* | 4/2010 | Kim ............ H01L 33/46 257/98 |
| 2010/0123268 A1 | 5/2010 | Menard |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0317132 A1 | 12/2010 | Rogers et al. |
| 2011/0211348 A1 | 9/2011 | Kim |
| 2012/0228669 A1 | 9/2012 | Bower et al. |
| 2012/0314388 A1 | 12/2012 | Bower et al. |
| 2013/0015483 A1* | 1/2013 | Shimokawa ........ H01L 33/46 257/98 |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0217448 A1* | 8/2014 | Kim ............ H01L 33/405 257/98 |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1* | 10/2015 | Fujimura ........ H01L 33/24 257/98 |
| 2015/0280089 A1* | 10/2015 | Obata ............ H01L 33/62 257/98 |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |

FOREIGN PATENT DOCUMENTS

| | | |
|---|---|---|
| WO | WO-2008/103931 A2 | 8/2008 |
| WO | WO-2010/032603 A1 | 3/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

Yaniv et al., A 640×480 Pixel Computer Display Using Pin Diodes with Device Redundancy, 1988 International Display Research Conference, IEEE, CH-2678-1/88:152-154 (1988).

U.S. Appl. No. 14/822,868, Bower et al.

Lee, S. H. etal, Laser Lift-Off of GaN Thin Film and its Application to the Flexible Light Emitting Diodes, Proc. of SPIE 8460:846011-1-846011-6 (2012).

* cited by examiner

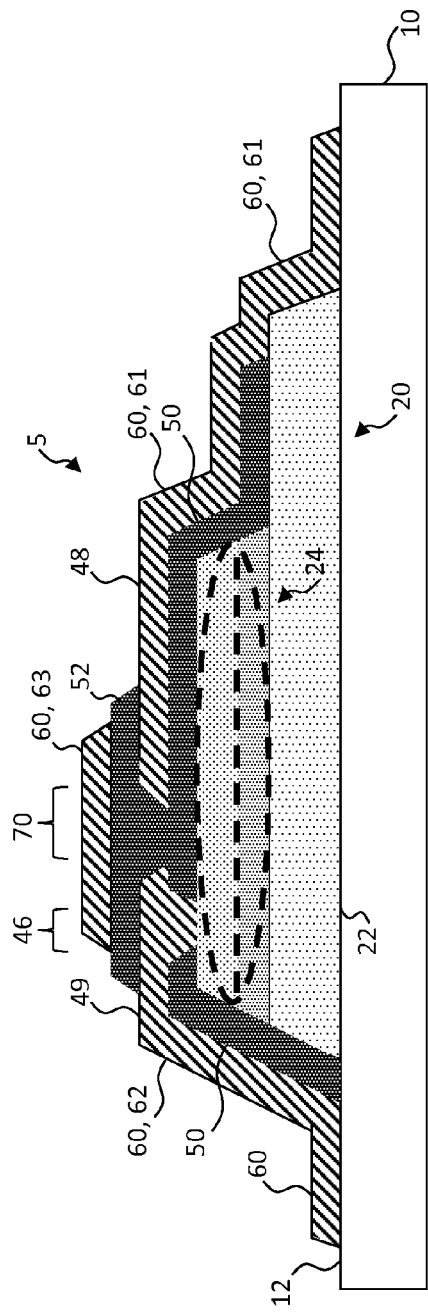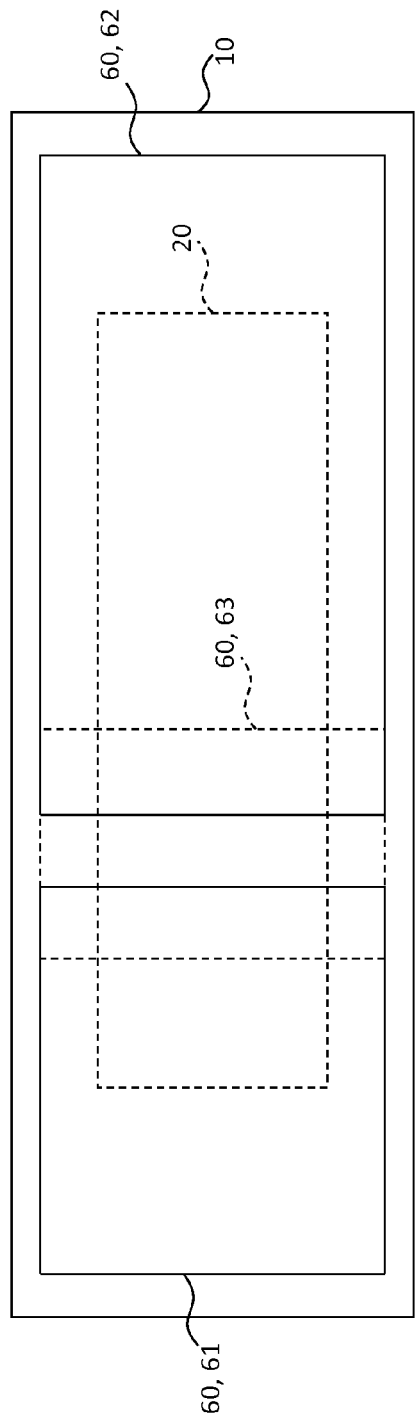
FIG. 1A
FIG. 1B

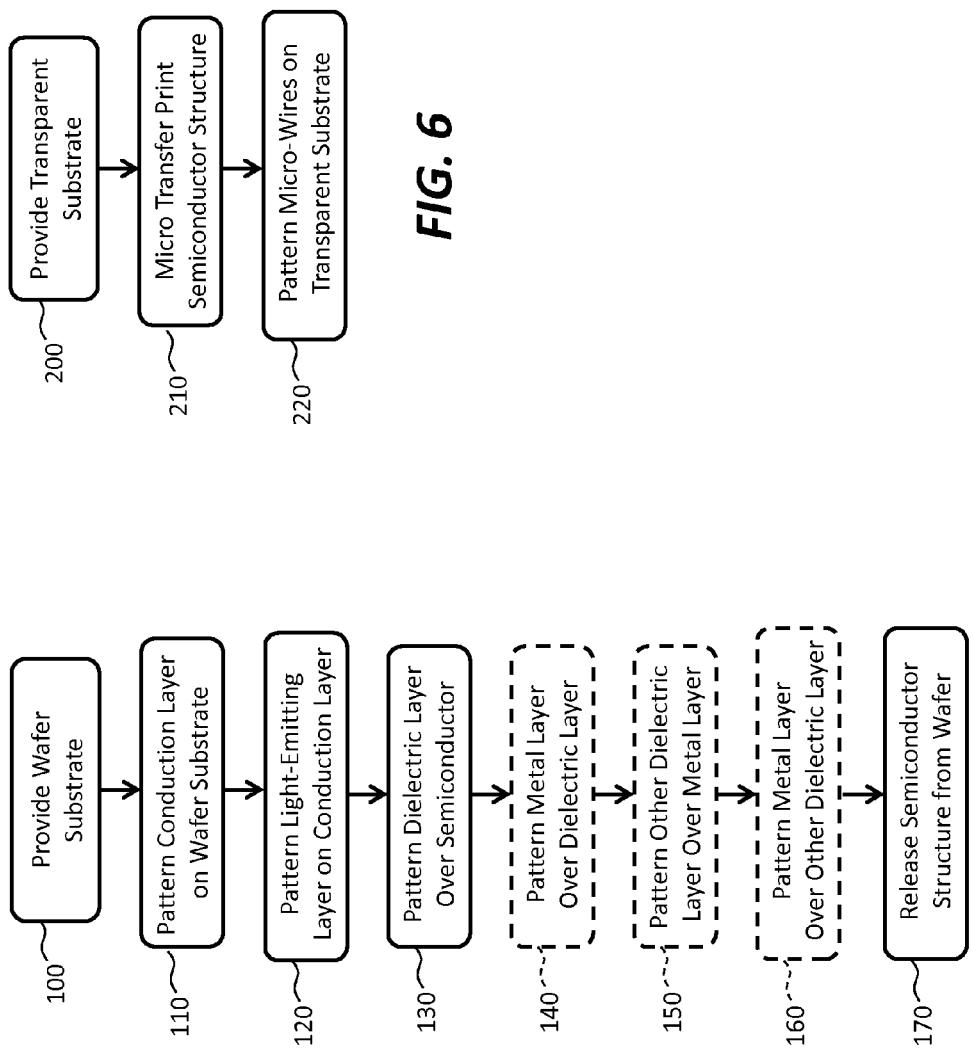

INORGANIC LIGHT-EMITTING DIODE WITH ENCAPSULATING REFLECTOR

CROSS REFERENCE TO RELATED APPLICATIONS

Reference is made to U.S. patent application Ser. No. 14/783,988 filed Jun. 18, 2015, entitled Micro-Assembled LED Displays and Lighting Elements, and U.S. Patent Application Ser. No. 62/055,472 filed Sep. 25, 2014, entitled Compound Micro-Assembly Strategies and Devices, the contents of each of which is incorporated by reference herein in its entirety.

FIELD OF THE INVENTION

The present invention relates to a light-emitting diode structure having an encapsulating reflector providing improved light output and efficiency.

BACKGROUND OF THE INVENTION

Inorganic light-emitting diodes (LEDs) are widely used in electronic devices as indicators and in displays. LEDs include a multi-layer doped crystalline semiconductor structure that responds to electrical current by emitting light. The frequency of the light emitted depends upon the bandgap and doping of the semiconductor. Electrical current is provided by a power supply connected to electrical contacts formed on the semiconductor.

Semiconductor materials have a large index of refraction, for example 3.96 compared to essentially 1.0 for air. Much of the light emitted from an LED is therefore trapped due to total internal reflection and is eventually converted to heat. This phenomenon is one of the greatest causes of LED inefficiency. To extract trapped light from an LED, a variety of light extraction and diffusion structures in the LED are proposed and are the subject of much research and development. For example, a hemispherical surface is often used to reduce total internal reflections in LEDs. U.S. Pat. No. 8,847,274 describes an LED encapsulated in a transparent metal oxide dome as well as a reflector. U.S. Pat. No. 8,680,556 also illustrates a dome structure with a high-reflectivity layer arranged to reflect emitted light. A light extraction layer is also shown together with a lateral-geometry LED having electrical contacts on a common side and a contact mesa.

Inorganic light-emitting diode displays can be formed using micro-LEDs (for example having an area less than 100 microns square or having an area small enough that it is not visible to an unaided observer of the display at a designed viewing distance) are known. However, micro-LED structures useful for enabling such transfer printing processes are not necessarily compatible with known light-extraction structures.

There remains a need, therefore, for improvements in light-emitting diode structures and manufacturing methods that are compatible with micro transfer printing and are effective in extracting light from a light-emitting diode.

SUMMARY OF THE INVENTION

The present invention provides a light-emitting diode structure and manufacturing method that is compatible with micro transfer printing and has an increased efficiency and improved light output. The construction process is compatible with existing photolithographic processes and is suitable for making a large number of light-emitting diodes on a conventional wafer.

According to embodiments of the present invention, a light-emitting diode located on a substrate includes electrical contacts on the same side of the semiconductor and opposite the substrate. A reflective layer is formed over and encapsulates the light-emitting portion of the semiconductor and, optionally, includes metal and is electrically connected to the electrical contacts. The reflective layer reflects light emitted from the semiconductor, typically at a non-orthogonal angle to the substrate surface on which the semiconductor is located, thereby reducing the amount of light absorbed in the LED structure and increasing the amount of light emitted from the light-emitting diode through the substrate.

In certain embodiments, the disclosed technology provides a bottom-emitting inorganic light-emitting diode structure having electrical contacts opposite a transparent substrate and an encapsulating reflective layer. The structure is compatible with micro transfer printing processes and increases the amount of light emitted from the light-emitting diode. This enables the construction of efficient inorganic light-emitting diode indicators and displays.

In one aspect, the disclosed technology includes an inorganic light-emitting diode structure, including: a transparent substrate; an inorganic semiconductor formed in a three-dimensional structure on the transparent substrate, the three-dimensional structure including: a conduction layer and a light-emitting layer disposed on the conduction layer, the light-emitting layer and the conduction layer each having first and second opposing sides, wherein a portion of the first side of the conduction layer is in contact with the second side of the light-emitting layer and the transparent substrate is adjacent to the second side of the conduction layer; a first metal contact in electrical contact with a first contact portion of the first side of the conduction layer; a second metal contact in electrical contact with a second contact portion of the first side of the light-emitting layer so that a current supplied between the first metal contact and the second metal contact through the inorganic semiconductor causes the light-emitting layer to emit light; a dielectric layer disposed on at least a portion of the light-emitting layer; and a reflective layer disposed on at least a portion of the dielectric layer, the reflective layer encapsulating the light-emitting layer exclusive of the portion of the conduction layer in contact with the light-emitting layer.

In certain embodiments, the reflective layer is at least partially in contact with the dielectric layer.

In certain embodiments, the reflective layer includes first and second portions and the first portion of the reflective layer is in electrical contact with the first metal contact.

In certain embodiments, the reflective layer includes first and second portions and the second portion of the reflective layer is in electrical contact with the second metal contact.

In certain embodiments, the reflective layer includes first, second, and third portions, the first portion of the reflective layer is in electrical contact with the first metal contact, the second portion of the reflective layer is in electrical contact with the second metal contact, the first and second portions of the reflective layer are separated by a gap located adjacent to the first side of the light-emitting layer, and the third portion of the reflective layer is electrically isolated from the first and second portions of the reflective layer and is located on a side of the gap opposite the first side of the light-emitting layer.

In certain embodiments, the structure includes another dielectric layer located between the third portion of the reflective layer and the first and second portions of the reflective layer.

In certain embodiments, the reflective layer includes first and second portions, the first portion of the reflective layer is in electrical contact with the first metal contact, the second portion of the reflective layer is in electrical contact with the second metal contact, and the first and second portions of the reflective layer are separated by a gap located adjacent to the first side of the conduction layer.

In certain embodiments, the structure includes a third portion of the reflective layer that is electrically isolated from the first and second portions of the reflective layer and is located on a side of the gap opposite the first side of the conduction layer.

In certain embodiments, the structure includes another dielectric layer located between the third portion of the reflective layer and the first and second portions of the reflective layer.

In certain embodiments, the reflective layer is an electrically conductive layer.

In certain embodiments, the reflective layer is a reflective metal layer.

In certain embodiments, the conduction layer is in contact with or adhered to the transparent substrate.

In certain embodiments, the inorganic light-emitting diode structure has at least one of a width, length, and height from 2 to 5 µm, 5 to 10 µm, 10 to 20 µm, or 20 to 50 µm.

In another aspect, the disclosed technology includes a multi inorganic light-emitting diode structure including a plurality of the inorganic light-emitting diode structures (e.g., as described above), wherein the transparent substrate is common to all of the plurality of inorganic light-emitting diode structures.

In certain embodiments, the first metal contacts of the plurality of inorganic light-emitting diode structures are electrically connected in common or the second metal contacts of the plurality of inorganic light-emitting diode structures are electrically connected in common.

In certain embodiments, the plurality of inorganic light-emitting diode structures on the common transparent substrate forms a display.

In certain embodiments, different ones of the plurality of inorganic light-emitting diode structures emit different colors of light.

In certain embodiments, the different ones of the plurality of inorganic light-emitting diode structures include different inorganic semiconductor materials.

In certain embodiments, the plurality of inorganic light-emitting diode structures are grouped into pixels, each pixel having two or more different inorganic semiconductor materials that emit different colors of light.

In certain embodiments, each pixel has three or more different inorganic semiconductors that emit at least red, green, and blue.

In certain embodiments, the inorganic light-emitting diode structures within each pixel group are spatially closer together than the inorganic light-emitting diode structures of another pixel group.

In certain embodiments, the multi inorganic light-emitting diode structure has at least one of a width, length, and height from 2 to 5 µm, 5 to 10 µm, 10 to 20 µm, or 20 to 50 µm.

In another aspect, the disclosed technology includes an inorganic light-emitting diode structure, including: a transparent substrate; an inorganic semiconductor formed in a three-dimensional structure on the transparent substrate, the three-dimensional structure including a conduction layer and a light-emitting layer disposed on the conduction layer, the light-emitting layer and the conduction layer each having first and second opposing sides, wherein only a portion of the first side of the conduction layer is in contact with the second side of the light-emitting layer and the transparent substrate is adjacent to the second side of the conduction layer; a first metal contact in electrical contact with a first contact portion of the first side of the conduction layer; a second metal contact in electrical contact with a second contact portion of the first side of the light-emitting layer so that a current supplied between the first metal contact and the second metal contact through the inorganic semiconductor causes the light-emitting layer to emit light; a dielectric layer located over at least a portion of the light-emitting layer; and a reflective layer located over at least a portion of the dielectric layer, the reflective layer encapsulating the light-emitting layer exclusive of the portion of the conduction layer in contact with the light-emitting layer, wherein the first and second metal contacts are electrically separate and are spatially separated by a gap over the first side of the conduction layer and not over the light-emitting layer.

In certain embodiments, the reflective layer is at least partially in contact with the dielectric layer.

In certain embodiments, the reflective layer includes first and second portions and the first portion of the reflective layer is in electrical contact with the first metal contact.

In certain embodiments, the reflective layer includes first and second portions and the second portion of the reflective layer is in electrical contact with the second metal contact.

In certain embodiments, the reflective layer includes first, second, and third portions, the first portion of the reflective layer is in electrical contact with the first metal contact, the second portion of the reflective layer is in electrical contact with the second metal contact, the first and second portions of the reflective layer are separated by a gap located adjacent to the first side of the light-emitting layer, and the third portion of the reflective layer is electrically isolated from the first and second portions of the reflective layer and is located on a side of the gap opposite the first side of the light-emitting layer.

In certain embodiments, the structure includes another dielectric layer located between the third portion of the reflective layer and the first and second portions of the reflective layer.

In certain embodiments, the reflective layer includes first and second portions, the first portion of the reflective layer is in electrical contact with the first metal contact, the second portion of the reflective layer is in electrical contact with the second metal contact, and the first and second portions of the reflective layer are separated by a gap located adjacent to the first side of the conduction layer.

In certain embodiments, the structure includes a third portion of the reflective layer that is electrically isolated from the first and second portions of the reflective layer and is located on a side of the gap opposite the first side of the conduction layer.

In certain embodiments, the structure includes another dielectric layer located between the third portion of the reflective layer and the first and second portions of the reflective layer.

In certain embodiments, the reflective layer is an electrically conductive layer.

In certain embodiments, the reflective layer is a reflective metal layer.

In certain embodiments, the conduction layer is in contact with or adhered to the transparent substrate.

In certain embodiments, the inorganic light-emitting diode structure has at least one of a width, length, and height from 2 to 5 µm, 5 to 10 µm, 10 to 20 µm, or 20 to 50 µm.

In another aspect, the disclosed technology includes a multi inorganic light-emitting diode structure including a plurality of the inorganic light-emitting diode structures (e.g., as described above), wherein the transparent substrate is common to all of the plurality of inorganic light-emitting diode structures.

In certain embodiments, the first metal contacts of the plurality of inorganic light-emitting diode structures are electrically connected in common or the second metal contacts of the plurality of inorganic light-emitting diode structures are electrically connected in common.

In certain embodiments, the plurality of inorganic light-emitting diode structures on the common transparent substrate forms a display.

In certain embodiments, different ones of the plurality of inorganic light-emitting diode structures emit different colors of light.

In certain embodiments, the different ones of the plurality of inorganic light-emitting diode structures include different inorganic semiconductor materials.

In certain embodiments, the plurality of inorganic light-emitting diode structures are grouped into pixels, each pixel having two or more different inorganic semiconductor materials that emit different colors of light.

In certain embodiments, each pixel has three or more different inorganic semiconductors that emit at least red, green, and blue.

In certain embodiments, the inorganic light-emitting diode structures within each pixel group are spatially closer together than the inorganic light-emitting diode structures of another pixel group.

In certain embodiments, the multi inorganic light-emitting diode structure has at least one of a width, length, and height from 2 to 5 µm, 5 to 10 µm, 10 to 20 µm, or 20 to 50 µm.

In another aspect, the disclosed technology includes an inorganic light-emitting diode structure, including: a transparent substrate; an inorganic semiconductor formed in a three-dimensional structure on the substrate, the three-dimensional structure including a conduction layer and a light-emitting layer disposed on the conduction layer, the light-emitting layer and the conduction layer each having first and second opposing sides, wherein only a portion of the first side of the conduction layer is in contact with the second side of the light-emitting layer and the substrate is adjacent to the second side of the conduction layer, wherein the conduction layer includes a first contact portion on the first side of the conduction layer and the light-emitting layer includes a second contact portion on the first side of the light-emitting layer such that a current supplied between the first contact portion and the second contact portion through the inorganic semiconductor causes the light-emitting layer to emit light; a dielectric layer disposed on at least a portion of the light-emitting layer; and a reflective layer disposed on at least a portion of the dielectric layer, the reflective layer encapsulating the light-emitting layer exclusive of the portion of the conduction layer in contact with the light-emitting layer.

In certain embodiments, the first contact portion is in electrical contact with a first metal contact and the second contact portion is in contact with a second metal contact.

In certain embodiments, the reflective layer is at least partially in contact with the dielectric layer.

In certain embodiments, the reflective layer includes first and second portions and the first portion of the reflective layer is in electrical contact with the first metal contact.

In certain embodiments, the reflective layer includes first and second portions and the second portion of the reflective layer is in electrical contact with the second metal contact.

In certain embodiments, the reflective layer includes first, second, and third portions, the first portion of the reflective layer is in electrical contact with the first metal contact, the second portion of the reflective layer is in electrical contact with the second metal contact, the first and second portions of the reflective layer are separated by a gap located adjacent to the first side of the light-emitting layer, and the third portion of the reflective layer is electrically isolated from the first and second portions of the reflective layer and is located on a side of the gap opposite the first side of the light-emitting layer.

In certain embodiments, the structure includes another dielectric layer located between the third portion of the reflective layer and the first and second portions of the reflective layer.

In certain embodiments, the reflective layer includes first and second portions, the first portion of the reflective layer is in electrical contact with the first metal contact, the second portion of the reflective layer is in electrical contact with the second metal contact, and the first and second portions of the reflective layer are separated by a gap located adjacent to the first side of the conduction layer.

In certain embodiments, the structure includes a third portion of the reflective layer that is electrically isolated from the first and second portions of the reflective layer and is located on a side of the gap opposite the first side of the conduction layer.

In certain embodiments, the structure includes another dielectric layer located between the third portion of the reflective layer and the first and second portions of the reflective layer.

In certain embodiments, the reflective layer is an electrically conductive layer.

In certain embodiments, the reflective layer is a reflective metal layer.

In certain embodiments, the conduction layer is in contact with or adhered to the transparent substrate.

In certain embodiments, the inorganic light-emitting diode structure has at least one of a width, length, and height from 2 to 5 µm, 5 to 10 µm, 10 to 20 µm, or 20 to 50 µm.

In another aspect, the disclosed technology includes a multi inorganic light-emitting diode structure including a plurality of the inorganic light-emitting diode structures (e.g., as described above), wherein the transparent substrate is common to all of the plurality of inorganic light-emitting diode structures.

In certain embodiments, the first metal contacts of the plurality of inorganic light-emitting diode structures are electrically connected in common or the second metal contacts of the plurality of inorganic light-emitting diode structures are electrically connected in common.

In certain embodiments, the plurality of inorganic light-emitting diode structures on the common transparent substrate forms a display.

In certain embodiments, different ones of the plurality of inorganic light-emitting diode structures emit different colors of light.

In certain embodiments, the different ones of the plurality of inorganic light-emitting diode structures include different inorganic semiconductor materials.

In certain embodiments, the plurality of inorganic light-emitting diode structures are grouped into pixels, each pixel having two or more different inorganic semiconductor materials that emit different colors of light.

In certain embodiments, each pixel has three or more different inorganic semiconductors that emit at least red, green, and blue.

In certain embodiments, the inorganic light-emitting diode structures within each pixel group are spatially closer together than the inorganic light-emitting diode structures of another pixel group.

In certain embodiments, the multi inorganic light-emitting diode structure has at least one of a width, length, and height from 2 to 5 µm, 5 to 10 µm, 10 to 20 µm, or 20 to 50 µm.

In another aspect, the disclosed technology includes an inorganic light-emitting diode structure, including: a transparent substrate and an inorganic semiconductor having a conduction layer and a light-emitting layer disposed on a portion of the conduction layer; a first metal contact in electrical contact with the conduction layer and a second metal contact in electrical contact with a second contact portion of the light-emitting layer so that a current supplied between the first metal contact and the second metal contact through the inorganic semiconductor causes the light-emitting layer to emit light; a dielectric layer disposed on at least a portion of the light-emitting layer; and a reflective layer disposed on at least a portion of the dielectric layer, the reflective layer encapsulating the light-emitting layer exclusive of the portion of the conduction layer in contact with the light-emitting layer.

In certain embodiments, the reflective layer is at least partially in contact with the dielectric layer.

In certain embodiments, the reflective layer includes first and second portions and the first portion of the reflective layer is in electrical contact with the first metal contact.

In certain embodiments, the reflective layer includes first and second portions and the second portion of the reflective layer is in electrical contact with the second metal contact.

In certain embodiments, the reflective layer includes first, second, and third portions, the first portion of the reflective layer is in electrical contact with the first metal contact, the second portion of the reflective layer is in electrical contact with the second metal contact, the first and second portions of the reflective layer are separated by a gap located adjacent to the first side of the light-emitting layer, and the third portion of the reflective layer is electrically isolated from the first and second portions of the reflective layer and is located on a side of the gap opposite the first side of the light-emitting layer.

In certain embodiments, the structure includes another dielectric layer located between the third portion of the reflective layer and the first and second portions of the reflective layer.

In certain embodiments, the reflective layer includes first and second portions, the first portion of the reflective layer is in electrical contact with the first metal contact, the second portion of the reflective layer is in electrical contact with the second metal contact, and the first and second portions of the reflective layer are separated by a gap located adjacent to the first side of the conduction layer.

In certain embodiments, the structure includes a third portion of the reflective layer that is electrically isolated from the first and second portions of the reflective layer and is located on a side of the gap opposite the first side of the conduction layer.

In certain embodiments, the structure includes another dielectric layer located between the third portion of the reflective layer and the first and second portions of the reflective layer.

In certain embodiments, the reflective layer is an electrically conductive layer.

In certain embodiments, the reflective layer is a reflective metal layer.

In certain embodiments, the conduction layer is in contact with or adhered to the transparent substrate.

In certain embodiments, the inorganic light-emitting diode structure has at least one of a width, length, and height from 2 to 5 µm, 5 to 10 µm, 10 to 20 µm, or 20 to 50 µm.

In another aspect, the disclosed technology includes a multi inorganic light-emitting diode structure including a plurality of the inorganic light-emitting diode structures (e.g., as described above), wherein the transparent substrate is common to all of the plurality of inorganic light-emitting diode structures.

In certain embodiments, the first metal contacts of the plurality of inorganic light-emitting diode structures are electrically connected in common or the second metal contacts of the plurality of inorganic light-emitting diode structures are electrically connected in common.

In certain embodiments, the plurality of inorganic light-emitting diode structures on the common transparent substrate forms a display.

In certain embodiments, different ones of the plurality of inorganic light-emitting diode structures emit different colors of light.

In certain embodiments, the different ones of the plurality of inorganic light-emitting diode structures include different inorganic semiconductor materials.

In certain embodiments, the plurality of inorganic light-emitting diode structures are grouped into pixels, each pixel having two or more different inorganic semiconductor materials that emit different colors of light.

In certain embodiments, each pixel has three or more different inorganic semiconductors that emit at least red, green, and blue.

In certain embodiments, the inorganic light-emitting diode structures within each pixel group are spatially closer together than the inorganic light-emitting diode structures of another pixel group.

In certain embodiments, the multi inorganic light-emitting diode structure has at least one of a width, length, and height from 2 to 5 µm, 5 to 10 µm, 10 to 20 µm, or 20 to 50 µm.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a cross section of an embodiment of the present invention;

FIG. 1B is a plan view of the embodiment illustrated in FIG. 1A;

FIGS. 5 and 6 are flow charts illustrating methods of the present invention.

Figure 2A:
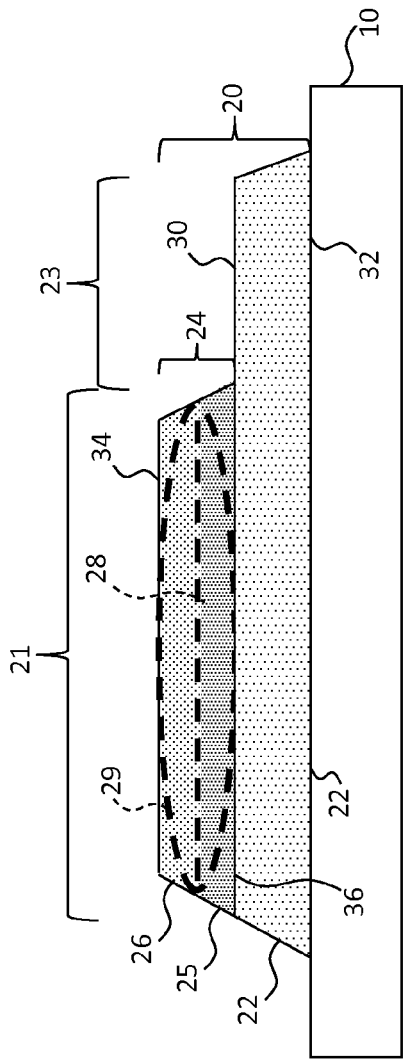
FIGS. 2A and 2B are cross sections illustrating details of the embodiment of the present invention illustrated in FIG. 1A.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2B:
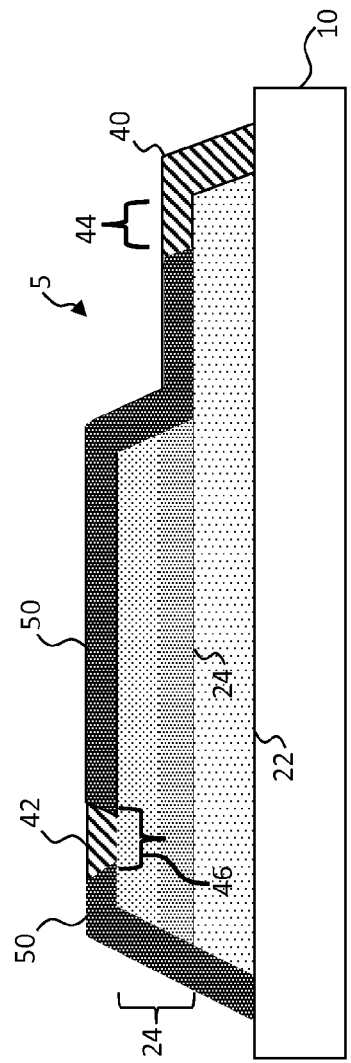
Figure 3A:
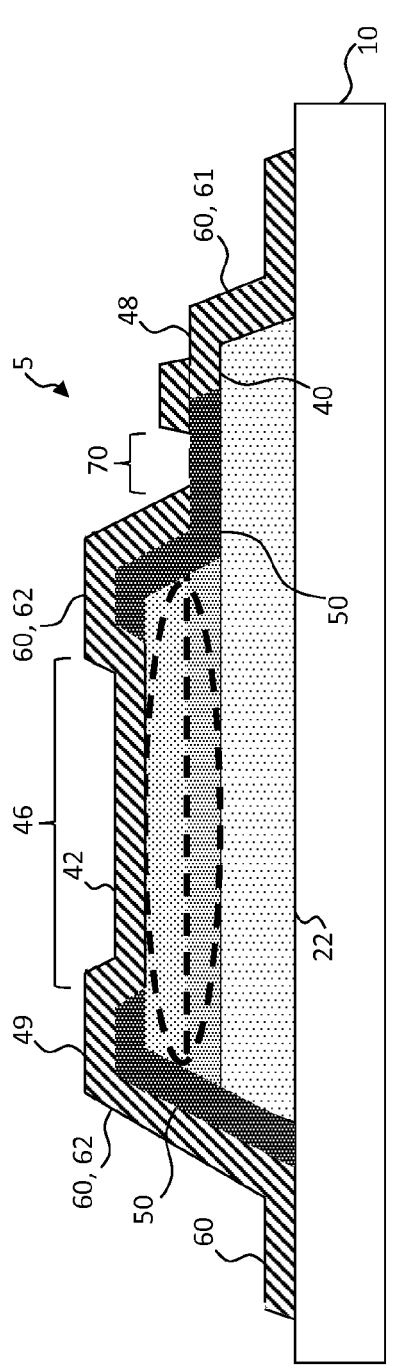
FIG. 3A is a cross section of another embodiment of the present invention.
Figure 3B:
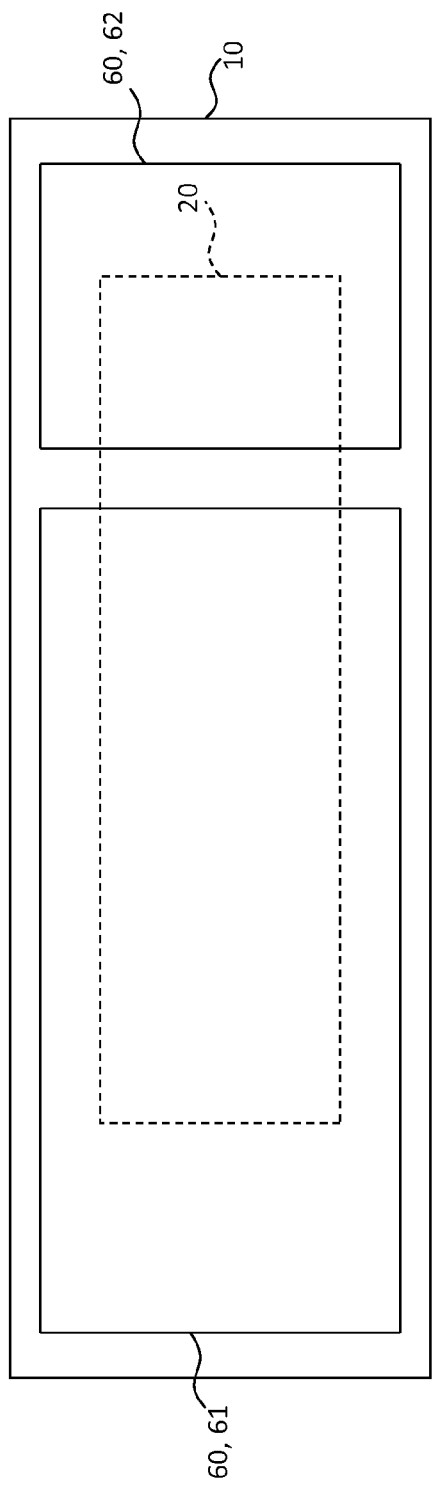
FIG. 3B is a plan view of the embodiment illustrated in FIG. 3A.

Referring to the cross section of FIG. 1A, the plan view of FIG. 1B, the detailed cross sections of FIGS. 2A, 2B and 3A, and the plan view of FIG. 3B, in an embodiment of the present invention, an inorganic light-emitting diode structure 5 includes a transparent substrate 10 having a transparent substrate surface 12 and an inorganic semiconductor structure 20 formed in a three-dimensional structure on the transparent substrate surface 12 of the transparent substrate 10. The three-dimensional inorganic semiconductor structure 20 includes a conduction layer 22 and a light-emitting layer 24 over and in contact with only a first portion 21 of the conduction layer 22 leaving a second portion 23 of the conduction layer 22 that is not covered by the light-emitting layer 24 (FIG. 2A). The light-emitting layer 24 and the conduction layer 22 each have first and second opposing sides 34, 36, 30, 32 (FIG. 2A), respectively. Only a portion of the first side 30 of the conduction layer 22 is in contact with the second side 36 of the light-emitting layer 24. The transparent substrate 10 is adjacent to the second side 32 of the conduction layer 22. In an embodiment, the second side 32 of the conduction layer 22 is in contact with or adhered to the transparent substrate 10.

Referring specifically to FIGS. 2A and 2B, a first metal contact 40 is in electrical contact with a first contact portion 44 of the first side 30 of the conduction layer 22. A second metal contact 42 is in electrical contact with a second contact portion 46 of the first side 34 of the light-emitting layer 24 so that a current supplied between the first metal contact 40 and the second metal contact 42 through the inorganic semiconductor structure 20 causes the light-emitting layer 24 to emit light. The first metal contact 40 can be electrically connected to an electrode such as first electrode 48 and the second metal contact 42 can be electrically connected to an electrode such as second electrode 49 (FIG. 1A). The first and second electrodes 48, 49 are electrically separate, can be spatially separated by a gap 70, and can each be individually electrically connected to external signals or power or ground sources. In an embodiment of the present invention, the gap 70 is located adjacent to, on, or over the first side 34 of the light-emitting layer 24, as shown in FIGS. 1A and 1B. In another embodiment of the present invention, the gap 70 is located adjacent to, on, or over the first side 30 of the conduction layer 22, as shown in FIGS. 3A and 3B.

A dielectric layer 50 encapsulates the light-emitting layer 24 exclusive of the second contact portion 46 and the portion of the conduction layer 22 in contact with the light-emitting layer 24.

A reflective layer 60 is located over the dielectric layer 50 encapsulating the light-emitting layer 24 exclusive of the portion of the conduction layer 22 in contact with the light-emitting layer 24. By exclusive of the portion of the conduction layer 22 in contact with the light-emitting layer 24 is meant that the entire light-emitting layer 24 is encapsulated, surrounded, or covered by the reflective layer 60 except the portion of the light-emitting layer 24 that is in contact with the conduction layer 22. By surrounded or encapsulated by the reflective layer 60 is meant that light emitted by the light-emitting layer 24 that is not emitted toward the conduction layer 22 and is not absorbed by the semiconductor itself is reflected at least once by the reflective layer 60. The reflective layer 60 can include multiple separate portions that are spatially separated and are not necessarily in physical contact and are not necessarily continuous. For example, the reflective layer 60 can include different spatially separated portions, as discussed further below and as shown in the FIGS. 1A and 3A.

In an embodiment, the reflective layer 60 includes, is a part of, or is in contact with the first or second metal contacts 40, 42 or the first or second electrodes 48, 49. For example, in an embodiment the reflective layer 60 includes a first portion 61 that is at least partly the second electrode 49 and the second metal contact 42 and a second portion 62 that is at least partly the first electrode 48 and the first metal contact 40. In an embodiment, the reflective layer 60 is at least partially in contact with the dielectric layer 50. Thus, in an embodiment, the reflective layer 60 is an electrically conductive layer or a reflective metal layer and can also be an electrical contact or conductor.

In the embodiment illustrated in FIGS. 1A and 1B, the gap 70 separating the first and second electrodes 48, 49 is located over the light-emitting layer 24. The inorganic light-emitting diode structure 5 further includes an other dielectric layer 52 located over the light-emitting layer 24 in the gap 70 and the reflective layer 60 includes a third portion 63 over the other dielectric layer 52 and over the light-emitting layer 24 in the gap 70 so that the other dielectric layer 52 is located between the third portion 63 of the reflective layer 60 and the first and second portions 61, 62 of the reflective layer 60. The third portion 63 of the reflective layer 60 can also be a metal, for example the same material that is used to form the first or second electrodes 48, 49 or the first or second metal contacts 40, 42. The different portions 61, 62, 63 of the reflective layer 60 can be the same material, such as a metal, or different materials. In the illustrated embodiment, the reflective layer 60 of the inorganic light-emitting diode structure 5 includes first, second, and third portions 61, 62, 63, the first portion 61 of the reflective layer 60 is in electrical contact with the first metal contact 40, the second portion 62 of the reflective layer 60 is in electrical contact with the second metal contact 42, the first and second portions 61, 62 of the reflective layer 60 are separated by a gap 70 located adjacent to the first side 34 of the light-emitting layer 24, and the third portion 63 of the reflective layer 60 is electrically isolated from the first and second portions 61, 62 of the reflective layer 60 and is located on a side of the gap 70 opposite the first side 34 of the light-emitting layer 24. Thus the reflective layer 60 encapsulates the light-emitting layer 24 exclusive of the portion of the conduction layer 22 in contact with the light-emitting layer 24 since any light emitted by the light-emitting layer 24 in any direction will be at least partially reflected by the reflective layer 60 except for light emitted through the portion of the conduction layer 22 in contact with the light-emitting layer 24. In this case, for example, the light emitted by the light-emitting layer 24 is reflected by the first and second electrodes 48, 49 and by the first and second metal contacts 40, 42 (corresponding to the first and second portions 61, 62 of the reflective layer 60), and by the third portion 63 of the reflective layer 60.

In the embodiment illustrated in FIGS. 3A and 3B, the gap 70 is located over the conduction layer 22 and not over the light-emitting layer 24. Thus, the reflective layer 60 includes first and second portions 61, 62, the first portion 61 of the reflective layer 60 is in electrical contact with the first metal contact 40, the second portion 62 of the reflective layer 60 is in electrical contact with the second metal contact 42, and the first and second portions 61, 62 of the reflective layer 60 are separated by a gap 70 located adjacent to the first side 30 of the conduction layer 22. The first and second metal contacts 40, 42 are electrically isolated and are spatially separated by the gap 70 over the first side 30 of the conduction layer 22 and not over the light-emitting layer 24. In this embodiment, the other dielectric layer 52 and the third portion 63 of the reflective layer 60 are unnecessary to encapsulate the light-emitting layer 24, but can be included so that a third portion 63 of the reflective layer 60 is electrically isolated from the first and second portions 61, 62 of the reflective layer 60 by another dielectric layer located between the third portion 63 of the reflective layer 60 and the first and second portions 61, 62 of the reflective layer 60 and is located on a side of the gap 70 opposite the first side 30 of the conduction layer 22 (not shown). Thus, either with or without the third portion 63 of the reflective layer 60, the reflective layer 60 encapsulates the light-emitting layer 24 exclusive of the portion of the conduction layer 22 in contact with the light-emitting layer 24 since any light emitted by the light-emitting layer 24 in any direction will be at least partially reflected by the reflective layer 60 at least once except for light emitted through the portion of the conduction layer 22 in contact with the light-emitting layer 24. In this case, for example, the light emitted by the light-emitting layer 24 is reflected by the second electrode 49 and by the second metal contact 42 (corresponding to the second portion 62 of the reflective layer 60.

The transparent substrate 10 can include any of a variety of materials useful for depositing semiconductor materials, for example glass, plastic, sapphire, or semiconductor wafers and can be rigid or flexible. The transparent substrate 10 can be 50%, 80%, 90%, or 95% or more transparent to visible light or to the light emitted by the light-emitting layer 24. The inorganic semiconductor 20 can be any semiconductor, doped or undoped, for example including silicon. The light-emitting layer 24 can have further sub-layers that can be doped with different materials in different amounts, for example with n-dopants and p-dopants in layers to form an n-zone 25 and p-zone 26 (FIG. 2A) demarcated by demarcation 28 and forming a light-emitting portion 29. The conduction layer 22 can also be doped with materials providing a layer that is both transparent and conductive. The metal contacts can be metal such as aluminum, silver, gold, tungsten, titanium, tin, or other metals, can be a metal alloy for example including such metals, can include such metals, or can be a metal oxide such as indium tin oxide or aluminum zinc oxide. The metal contacts can be highly reflective, for example reflecting more than 25%, 50%, 60%, 70%, 80%, 90%, or 95% of visible light or light emitted by the light-emitting layer 24. The dielectric layer 50 can be an oxide or nitride material, for example silicon oxide or silicon nitride. The reflective layer 60 can include a metal, such as aluminum, silver, gold, tungsten, titanium, or tin or combinations of metals. In one embodiment, the reflective layer 60 includes some or all of the same materials as the first, or second metal contacts 40, 42. Similarly, the first and second metal contacts 40, 42 can include the same material and can be formed at the same time and with the same process steps. The reflective layer 60 can be the first and second electrodes 48, 49 and first and second metal contacts 40, 42.

The conduction layer 22, light-emitting layer 24, dielectric layer 50, reflective layer 60, or first or second metal contacts 40, 42 can be thin and have a thickness less than or equal to 100 nm, less than or equal to 1 micron, less than or equal to 10 microns, or less than or equal to 100 microns.

According to embodiments of the present invention, the inorganic semiconductor structure 20 and first or second metal contacts 40, 42 are formed on the transparent substrate 10 or on another substrate, for example a semiconductor wafer, using photolithographic deposition and patterning methods. Alternatively, the inorganic light-emitting-diode structure 5 can be located on the transparent substrate 10 by micro transfer printing.

Figure 4:
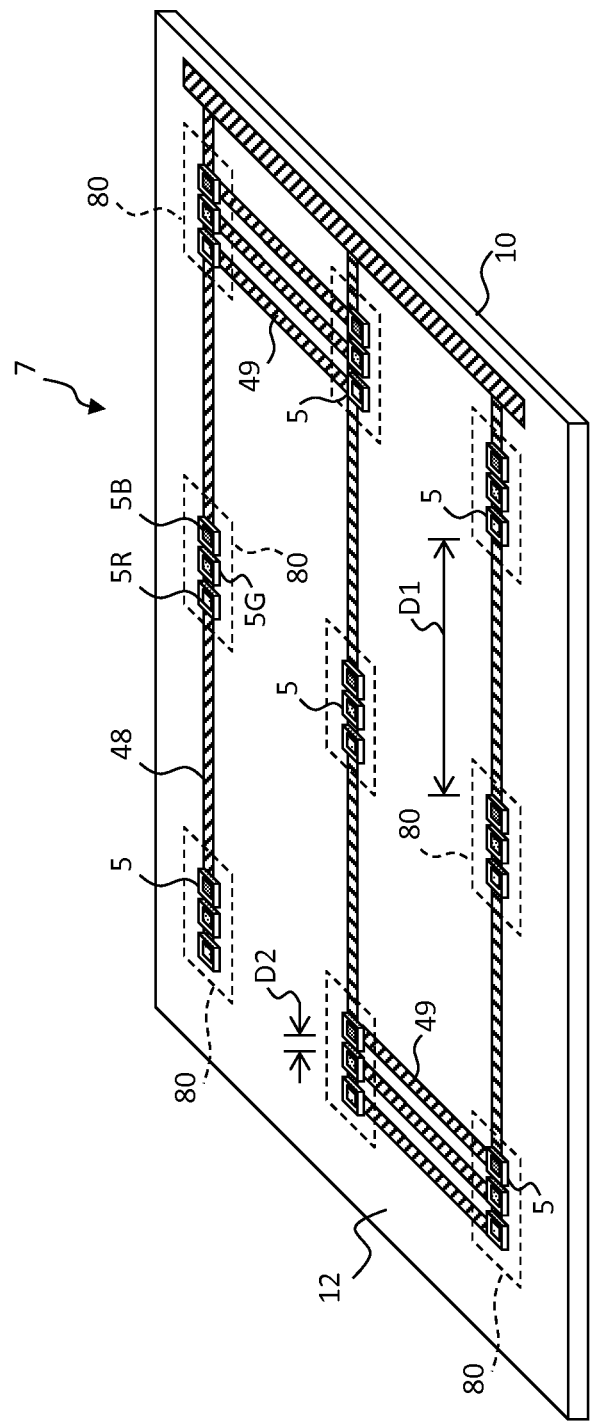
FIG. 4 is a perspective of an embodiment of the present invention including a plurality of inorganic light-emitting diode structures distributed over a substrate.

Referring next to FIG. 4, in an embodiment of the present invention, a multi inorganic light-emitting diode structure 7 includes a plurality of the inorganic light-emitting diode structures 5 formed or located in common on the transparent substrate surface 12 of the transparent substrate 10. The first metal contacts 40 (FIGS. 1A, 3A) of the plurality of inorganic light-emitting diode structures 5 are electrically connected in common, for example with electrodes 48. Alternatively or in addition, the second metal contacts 42 of the plurality of inorganic light-emitting diode structures 5 are electrically connected in common with electrodes (e.g. second electrodes 49 as also shown in FIGS. 1A, 3A). (For clarity, only some of the second electrodes 49 are shown in FIG. 4.) Thus a single signal, power, or ground line (e.g., first or second electrodes 48, 49) can connect to all of the first or second metal contacts 40, 42 of the plurality of inorganic light-emitting diode structures 5 at once, reducing the number of different wires or electrodes 48 needed to control the inorganic light-emitting diode structures 5.

In another embodiment and as shown in FIG. 4, the plurality of inorganic light-emitting diode structures 5 on the common transparent substrate 10 forms a display. Different ones of the plurality of inorganic light-emitting diode structures 5 include two or more different inorganic semiconductor materials and can be grouped into pixels 80 that emit different colors of light and form a color display. For example, each pixel group 80 includes three or more different inorganic semiconductor materials and forms a full-color display emitting red, green, and blue light from corresponding different inorganic red-light-emitting diode structures 5R, inorganic green-light-emitting diode structures 5G, and inorganic blue-light-emitting diode structures 5B. In such an arrangement, the inorganic light-emitting diode structures 5 within each multi-color pixel group 80 are spatially closer (e.g., by distance D2) together than the inorganic light-emitting diode structures 5 of another multi-color pixel group 80 (e.g., by distance D1).

Referring next to FIG. 5, in an embodiment of the present invention, the inorganic light-emitting diode structure 5 or the multi inorganic light-emitting diode structure 7 of the present invention is constructed by first providing in step 100 a wafer substrate. A conduction layer 22 is patterned on the wafer substrate in step 110. The conduction layer 22 can included a semiconductor or doped semiconductor that renders the conduction layer 22 both transparent and electrically conductive. In step 120, the light-emitting layer 24 is formed on the conduction layer 22 and can also be doped, formed in multiple sub-layers for example to form differently doped sub-layers having an n-zone (e.g., n-zone 25) or a p-zone (e.g., p-zone 26) that together enable efficient electron-hole combination to emit light. In various embodiments, steps 110 and 120 can be performed in a reverse order or can include additional steps done in various orders. For example, a blanket conduction layer such as a metal layer can be deposited on the substrate, followed by one or more semiconductor layers such as light-emitter layers that can also be doped with various dopants. The semiconductor layer(s) can then be etched to pattern the semiconductor layers (step 120) followed by an additional etch step to pattern the conduction (metal) layer (step 110). The dielectric layer 50 is patterned over the light-emitting layer 24 and conduction layer 22 with vias corresponding to the first and second contact portions 44, 46 in step 130 to enable the formation of first and second electrical contacts, e.g., first and second metal contacts 40, 42, in a metal layer patterned in step 140. In an optional step, for example as illustrated in the structure of FIG. 1A, an other dielectric layer 52 is patterned over the metal layer in step 150 and a metal layer, for example forming the third portion 63 of the reflective layer 60, is patterned in step 160.

Thus, in an embodiment of the present invention, the inorganic light-emitting diode structure 5 includes a substrate, for example a semiconductor substrate or an insulating substrate such as sapphire, an inorganic semiconductor 20 formed in a three-dimensional structure on the substrate, the three-dimensional structure including a conduction layer 22 and a light-emitting layer 24 over and in contact with only a portion of the conduction layer 22, the light-emitting layer 24 and the conduction layer 22 each having first and second opposing sides 34, 36, 30, 32, wherein only a portion of the first side 30 of the conduction layer 22 is in contact with the second side 36 of the light-emitting layer 24 and the substrate is adjacent to the second side 32 of the conduction layer 22. A first contact portion 44 is located on the first side 30 of the conduction layer 22 and a second contact portion 46 is located on the first side 34 of the light-emitting layer 24 so that a current supplied between the first contact portion 44 and the second contact portion 46 through the inorganic semiconductor 20 causes the light-emitting layer 24 to emit light. A dielectric layer 50 is located over at least a portion of the light-emitting layer 24 and a reflective layer 60 is located over at least a portion of the dielectric layer 50. The reflective layer 60 encapsulates the light-emitting layer 24 exclusive of the portion of the conduction layer 22 in contact with the light-emitting layer 24. In a further embodiment, the first contact portion 44 is in electrical contact with a first metal contact 40 and the second contact portion 46 is in contact with a second metal contact 42. The described structures and materials can be deposited, formed, and patterned using photolithographic materials, tools, and processes known in the integrated circuit art.

In step 170, the inorganic light-emitting diode structures 5 are released, for example by etching a sacrificial layer in the wafer substrate beneath the conduction layer 22. Referring next to FIG. 6, a transparent substrate 10 is provided in step 200 and the released inorganic light-emitting diode structures 5 are micro transfer printed in step 210 from the native source wafer substrate in or on which the inorganic light-emitting diode structures 5 are formed to the non-native destination transparent substrate 10. For a discussion of micro-transfer printing techniques see, U.S. Pat. Nos. 8,722,458, 7,622,367 and 8,506,867, each of which is hereby incorporated by reference. After the inorganic light-emitting diode structures 5 are transferred to the destination transparent substrate 10, micro-wires are patterned (for example the first and second electrodes 48, 49) on the transparent substrate 10 to electrically connect the inorganic light-emitting diode structures 5. In various embodiments of the present invention, the micro-wires are patterned on the transparent substrate 10 before, after, or both before and after the inorganic light-emitting diode structures 5 are transferred to the transparent substrate 10. In other embodiments, the first and second metal contacts 40, 42 are formed after the inorganic light-emitting diode structures 5 are transferred to the transparent substrate 10 and in a common step with the micro-wire patterning in step 220.

In an alternative embodiment, the inorganic light-emitting diode structures 5 are transferred, for example by micro transfer printing to an intermediate pixel substrate and electrically interconnected on the intermediate pixel substrate. The intermediate pixel substrates are then transferred to the destination transparent substrate 10. A further discussion of utilizing pixel substrates in a display can be found in U.S. Patent Application Ser. No. 62/055,472 filed Sep. 25, 2014, entitled Compound Micro-Assembly Strategies and Devices, the contents of which are incorporated by reference herein in its entirety.

In an embodiment of the present invention, the inorganic light-emitting diode structures 5 are micro-light-emitting diodes (micro-LEDs), for example having light-emissive areas of less than 10, 20, 50, or 100 square microns. For example, the inorganic light-emitting diode structures 5 can have a height, length, and/or width from 2 to 5 μm, 4 to 10 μm, 10 to 20 μm, or 20 to 50 μm. Such micro-LEDs have the advantage of a small light-emissive area compared to their brightness as well as color purity providing highly saturated display colors and a substantially Lambertian emission providing a wide viewing angle for the inorganic-light-emitter display 5 of the present invention. A discussion of micro-LEDs and micro-LED displays can be found in U.S. patent application Ser. No. 14/783,988, filed Jun. 18, 2015, entitled Micro Assembled Micro LED Displays and Lighting Elements, the contents of which is incorporated by reference herein in its entirety.

The inorganic light-emitting diode structures 5 can be operated as a display by control, power, and ground electrical signals provided, for example, by an external controller (not shown). The controller provides the signals through first and second electrodes 48, 49 to the inorganic light-emitting diode structures 5. The signals are conducted to the first and second metal contacts 40, 42 and through the first and second contact portions 44, 46 into the conduction layer 22 and the light-emitting layer 24. The electrical signal in the conduction layer 22 is conducted to and through the interface between the conduction layer 22 and the light-emitting layer 24 where light is emitted. The emitted light is emitted in all directions. The light emitted through the conduction layer 22 passes through the transparent substrate 10 to a viewer. The light emitted in any other direction strikes the encapsulating reflective layer 60 at least once and is reflected back through the transparent substrate 10 or is reflected again until it is absorbed. Thus, according to the present invention, the reflective layer 60 increases the amount of light output from the inorganic light-emitting diode structure 5, increases the efficiency of the inorganic light-emitting diode structure 5, and reduces heating of the inorganic light-emitting diode structure 5.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or including specific components, or where processes and methods are described as having, including, or including specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

D1 distance
D2 distance
5 inorganic light-emitting diode structure
5R inorganic red-light-emitting diode structure
5G inorganic green-light-emitting diode structure
5B inorganic blue-light-emitting diode structure
7 multi inorganic light-emitting diode structure
10 transparent substrate
12 transparent substrate surface
20 inorganic semiconductor structure
21 first portion of conduction layer
22 conduction layer
23 second portion of conduction layer
24 light-emitting layer
25 n-zone
26 p-zone
28 demarcation
29 light-emitting portion
30 first side of conduction layer
32 second side of conduction layer
34 first side of light-emitting layer
36 second side of light-emitting layer
40 first metal contact
42 second metal contact
44 first contact portion
46 second contact portion
48 electrode/first electrode
49 second electrode
50 dielectric layer
52 other dielectric layer
60 reflective layer
61 first portion of reflective layer
62 second portion of reflective layer
63 third portion of reflective layer
70 gap
80 multi-color pixel 100 provide display substrate step
110 pattern conduction layer on display substrate step
120 pattern light-emitting layer on conduction layer step
130 pattern dielectric layer over semiconductor step
140 pattern metal layer over dielectric layer step
150 pattern other dielectric layer over metal layer step
160 pattern metal layer over other dielectric layer step
170 release semiconductor structure from wafer step
200 provide transparent substrate step
210 micro transfer print semiconductor step
220 pattern micro-wires on transparent substrate step

What is claimed:

1. An inorganic light-emitting diode structure, comprising:
   a transparent substrate; and
   two or more inorganic semiconductors, each formed in a three-dimensional structure adhered to a common side of the transparent substrate, each three-dimensional structure comprising:
      a conduction layer;
      a light-emitting layer disposed on the conduction layer, the light-emitting layer and the conduction layer each having first and second opposing sides, wherein a portion of the first side of the conduction layer is in contact with the second side of the light-emitting layer and the transparent substrate is adjacent to the second side of the conduction layer;
      a first metal contact in electrical contact with a first contact portion of the first side of the conduction layer;
      an electrode comprising a second metal contact in electrical contact with a second contact portion of the first side of the light-emitting layer so that a current supplied between the first metal contact and the second metal contact through the inorganic semiconductor causes the light-emitting layer to emit light;
      a dielectric layer disposed on at least a portion of the light-emitting layer; and
      a reflective layer having one or more portions disposed on at least a portion of the dielectric layer, the reflective layer surrounding the light-emitting layer exclusive of the portion of the conduction layer in contact with the light-emitting layer, wherein:
         the one or more portions of the reflective layer comprises the electrode, and
         the dielectric layer and the electrode are in direct contact with the transparent substrate only on the common side on which the three-dimensional structures are disposed.

2. The inorganic light-emitting diode structure of claim 1, wherein the reflective layer is at least partially in contact with the dielectric layer.

3. The inorganic light-emitting diode structure of claim 1, wherein the reflective layer comprises first and second portions and the first portion of the reflective layer is in electrical contact with the first metal contact.

4. The inorganic light-emitting diode structure of claim 1, wherein the reflective layer comprises first and second portions and the second portion of the reflective layer is in electrical contact with the second metal contact and the second portion of the reflective layer forms an electrode.

5. The inorganic light-emitting diode structure of claim 1, wherein the reflective layer comprises first, second, and third portions, the first portion of the reflective layer is in electrical contact with the first metal contact, the second portion of the reflective layer is in electrical contact with the second metal contact, the first and second portions of the reflective layer are separated by a gap located adjacent to the first side of the light-emitting layer, and the third portion of the reflective layer is electrically isolated from the first and second portions of the reflective layer and is located on a side of the gap opposite the first side of the light-emitting layer.

6. The inorganic light-emitting diode structure of claim 5, comprising another dielectric layer located between and in contact with the third portion of the reflective layer and the first and second portions of the reflective layer.

7. The inorganic light-emitting diode structure of claim 1, wherein the reflective layer comprises first and second portions, the first portion of the reflective layer is in electrical contact with the first metal contact, the second portion of the reflective layer is in electrical contact with the second metal contact, and the first and second portions of the reflective layer are separated by a gap located adjacent to the first side of the conduction layer.

8. The inorganic light-emitting diode structure of claim 7, comprising a third portion of the reflective layer that is electrically isolated from the first and second portions of the reflective layer and is located on a side of the gap opposite the first side of the conduction layer.

9. The inorganic light-emitting diode structure of claim 8, comprising another dielectric layer located between the third portion of the reflective layer and the first and second portions of the reflective layer.

10. The inorganic light-emitting diode structure of claim 1, wherein the reflective layer is an electrically conductive layer.

11. The inorganic light-emitting diode structure of claim 1, wherein the reflective layer is a reflective metal layer.

12. The inorganic light-emitting diode structure of claim 1, wherein the inorganic light-emitting diode structure has at least one of a width, length, and height from 2 to 5 µm, 5 to 10 µm, 10 to 20 µm, or 20 to 50 µm.

13. The inorganic light-emitting diode structure of claim 1, wherein the first metal contacts of the two or more inorganic semiconductors are electrically connected in common or the second metal contacts of the two or more inorganic light-emitting diode structures are electrically connected in common.

14. The inorganic light-emitting diode structure of claim 1, wherein the two or more semiconductors structures on the common transparent substrate forms a display.

15. The inorganic light-emitting diode structure of claim 1, wherein different ones of the two or more semiconductors structures emit different colors of light.

16. The inorganic light-emitting diode structure of claim 15, wherein the different ones of the two or more inorganic semiconductors comprise different inorganic semiconductor materials.

17. The multi inorganic light-emitting diode structure of claim 1, wherein the two or more inorganic semiconductors are grouped into pixels, each pixel having two or more different inorganic semiconductor materials that emit different colors of light.

18. The inorganic light-emitting diode structure of claim 17, wherein each pixel has three or more different inorganic semiconductors that emit at least red, green, and blue.

19. The inorganic light-emitting diode structure of claim 17, wherein inorganic light-emitting diode structures within each pixel group are spatially closer together than inorganic light-emitting diode structures of another pixel group.

20. The inorganic light-emitting diode structure of claim 1, wherein the inorganic semiconductor structure has at least one of a width, length, and height from 2 to 5 µm, 5 to 10 µm, 10 to 20 µm, or 20 to 50 µm.

21. The inorganic light-emitting diode structure of claim 1, wherein the transparent substrate is a glass, a polymer, or a plastic.

22. An inorganic light-emitting diode structure, comprising:
a transparent substrate; and
two or more inorganic semiconductors, each formed in a three-dimensional structure adhered to a common side of the transparent substrate, each three-dimensional structure comprising:
a conduction layer,
a light-emitting layer disposed on the conduction layer, the light-emitting layer and the conduction layer each having first and second opposing sides, wherein only a portion of the first side of the conduction layer is in contact with the second side of the light-emitting layer and the transparent substrate is adjacent to the second side of the conduction layer;
a first metal contact in electrical contact with a first contact portion of the first side of the conduction layer;
an electrode comprising a second metal contact in electrical contact with a second contact portion of the first side of the light-emitting layer so that a current supplied between the first metal contact and the second metal contact through the inorganic semiconductor causes the light-emitting layer to emit light;
a dielectric layer located over at least a portion of the light-emitting layer; and
a reflective layer having one or more portions located over at least a portion of the dielectric layer, the reflective layer surrounding the light-emitting layer exclusive of the portion of the conduction layer in contact with the light-emitting layer, wherein the first and second metal contacts are electrically separate and are spatially separated by a gap over the first side of the conduction layer and not over the light-emitting layer, wherein:
the one or more portions of the reflective layer comprises the electrode, and
the dielectric layer and the electrode are in direct contact with the transparent substrate only on the common side on which the three-dimensional structures are disposed.

23. An inorganic light-emitting diode structure, comprising:
a transparent substrate; and
two or more inorganic semiconductors, each formed in a three-dimensional structure adhered to a common side of the substrate, each three-dimensional structure comprising:
a conduction layer,
a light-emitting layer disposed on the conduction layer, the light-emitting layer and the conduction layer each having first and second opposing sides, wherein only a portion of the first side of the conduction layer is in contact with the second side of the light-emitting layer and the substrate is adjacent to the second side of the conduction layer, wherein the conduction layer comprises a first contact portion on the first side of the conduction layer and the light-emitting layer comprises a second contact portion on the first side of the light-emitting layer such that a current supplied between the first contact portion and the second contact portion through the inorganic semiconductor causes the light-emitting layer to emit light;

a dielectric layer disposed on at least a portion of the light-emitting layer; and a reflective layer having one or more portions disposed on at least a portion of the dielectric layer, the reflective layer surrounding the light-emitting layer exclusive of the portion of the conduction layer in contact with the light-emitting layer, wherein the dielectric layer is in direct contact with the transparent substrate only on the common side on which the three-dimensional structures are disposed.

24. The inorganic light-emitting diode structure of claim 23, wherein the first contact portion is in electrical contact with a first metal contact and the second contact portion is in contact with an electrode comprising a second metal contact, wherein:

the one or more portions of the reflective layer comprises the electrode, and the electrode is in contact with the transparent substrate only on the side on which the three-dimensional structures are disposed.

25. An inorganic light-emitting diode structure, comprising:

a transparent substrate;

two or more inorganic semiconductors, each comprising:

a conduction layer;

a light-emitting layer disposed on a portion of the conduction layer;

a first metal contact in electrical contact with the conduction layer; and an electrode comprising a second metal contact in electrical contact with a second contact portion of the light-emitting layer so that a current supplied between the first metal contact and the second metal contact through the inorganic semiconductor causes the light-emitting layer to emit light;

a dielectric layer disposed on at least a portion of the light-emitting layer; and a reflective layer having one or more portions disposed on at least a portion of the dielectric layer, the reflective layer surrounding the light-emitting layer exclusive of the portion of the conduction layer in contact with the light-emitting layer, wherein:

the one or more portions of the reflective layer comprises the electrode, and the dielectric layer and the electrode are in direct contact with the transparent substrate only on the side on which the three-dimensional structures are disposed.

* * * * *